United States Patent
Anderson et al.

(10) Patent No.: US 7,035,134 B2
(45) Date of Patent: Apr. 25, 2006

(54) MEMORY SYSTEM AND ASSOCIATED METHODOLOGY

(75) Inventors: Scott A. Anderson, Wellington, CO (US); Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 221 days.

(21) Appl. No.: 10/791,131

(22) Filed: Mar. 2, 2004

(65) Prior Publication Data
US 2005/0195641 A1  Sep. 8, 2005

(51) Int. Cl.
*G11C 11/00* (2006.01)
(52) U.S. Cl. .................. 365/154; 365/156; 365/72
(58) Field of Classification Search .............. 365/154, 365/156, 72
See application file for complete search history.

(56) References Cited

U.S. PATENT DOCUMENTS 6,166,946 A * 12/2000 Naffziger ............... 365/154
6,373,745 B1 * 4/2002 Saito et al. ............ 365/174

* cited by examiner

*Primary Examiner*—Anh Phung
*Assistant Examiner*—Toan Le

(57) ABSTRACT

A memory system includes a first plurality of memory cells, wherein each of the first plurality of memory cells includes a first node and a second node that are configured to have opposite logic values, and a second plurality of memory cells, wherein each of the second plurality of memory cells includes a first node and a second node that are configured to have opposite logic values. Providing a pre-program data value to the first nodes of the first plurality of memory cells, and to the second nodes of the second plurality of memory cells enables the memory system to be pre-programmed.

22 Claims, 11 Drawing Sheets

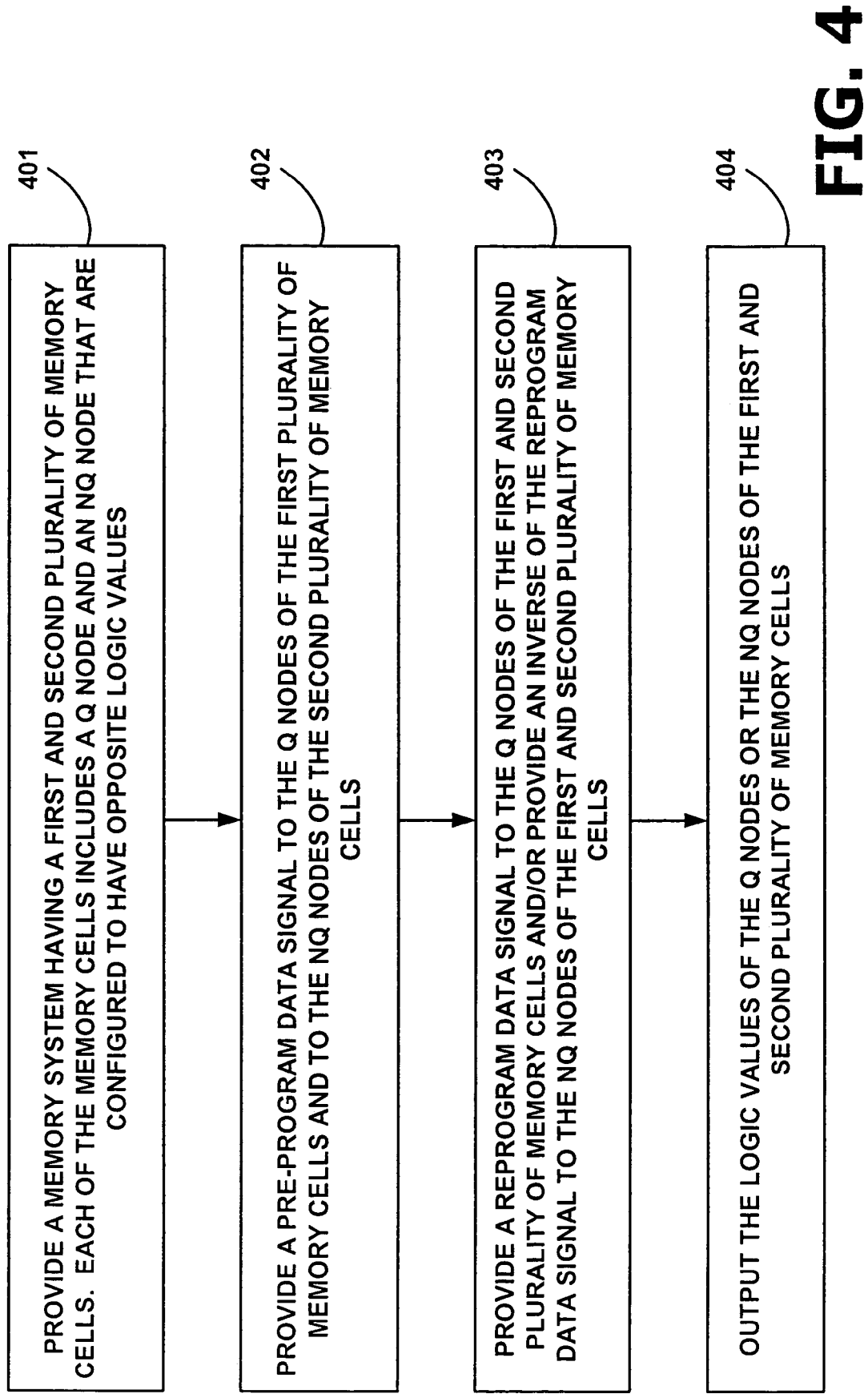

MEMORY SYSTEM AND ASSOCIATED METHODOLOGY

BACKGROUND

Many microprocessors, microcontrollers, systems-on-a-chip (SOC), and other general-purpose execution devices include embedded firmware. This embedded firmware has an advantage over non-embedded firmware in that it can be more area-efficient and can enable the execution device to be self-contained. It is desirable to have firmware ready at power-up to avoid a delay incurred by reading-in the programming from off-chip storage. To meet this need, the firmware has traditionally been implemented as a ROM (read-only memory).

The most area-efficient ROMs lack flexibility, as they are hard-wired. Although reprogrammable ROMs may be used, they are considerably less area-efficient and require special VLSI (very large-scale integrated circuit) manufacturing processes, thereby incurring additional costs. Another approach uses a RAM (random-access memory) to enable reprogramming. However, RAM does not enable firmware to be pre-programmed. Instead, a program has to be loaded into the RAM from an external source.

SUMMARY

A memory system and related methods are disclosed. An embodiment of the memory system includes a first plurality of memory cells, wherein each of the first plurality of memory cells includes a first node and a second node that are configured to have opposite logic values, and a second plurality of memory cells, wherein each of the second plurality of memory cells includes a first node and a second node that are configured to have opposite logic values. Providing a pre-program data value to the first nodes of the first plurality of memory cells, and to the second nodes of the second plurality of memory cells enables the memory system to be pre-programmed.

An embodiment of a method for programming a memory system includes providing a pre-program data value to first nodes of a first plurality of memory cells, and providing the pre-program data value to second nodes of a second plurality of memory cells.

Another embodiment of a memory system includes a first and second plurality of memory cells, wherein each of the first and second plurality of memory cells includes a first node and a second node that are configured to have opposite logic values, and means for providing a pre-program data value to the first nodes of the first plurality of memory cells and to the second nodes of the second plurality of memory cells for enabling the memory system to be pre-programmed.

BRIEF DESCRIPTION OF THE DRAWINGS

Memory systems and related methods are illustrated by way of example and not limited by the implementations illustrated in the following drawings. The components in the drawings are not necessarily to scale. Like reference numerals designate corresponding parts throughout the several views.

FIG. 4 is a flow chart depicting an embodiment of a method for utilizing the memory system depicted in FIG. 1A.

DETAILED DESCRIPTION

According to one embodiment, among others, a memory system is configured such that one signal causes some memory cells to be pre-programmed as a logic "high," but causes other memory cells to be pre-programmed as a logic "low." Other signals may later be used to reprogram the memory cells. This approach enables area-efficiency, pre-programmability, and reprogrammability, as will be explained in more detail below.

Figure 1A:
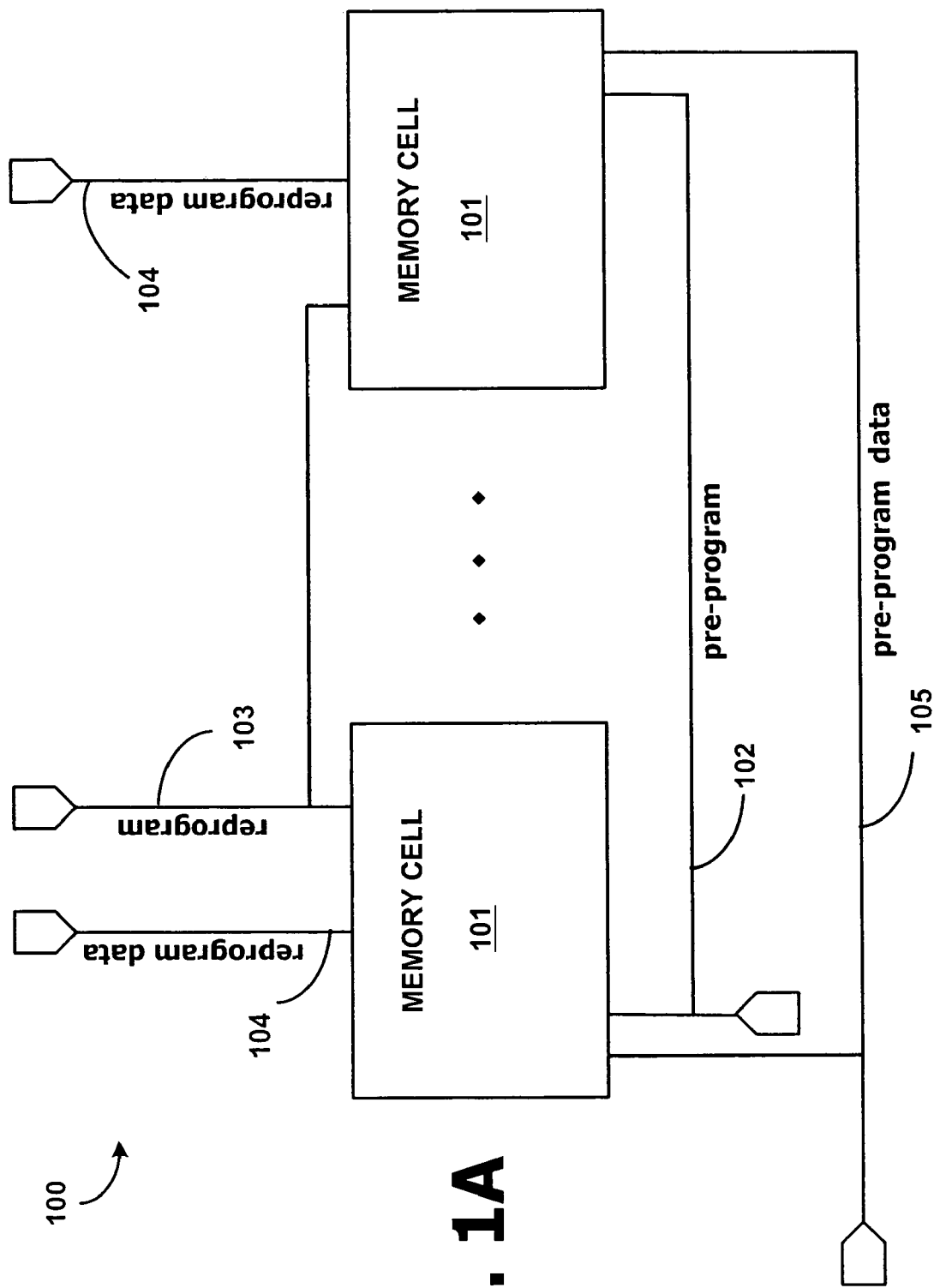
FIG. 1A is a block diagram depicting an embodiment of a memory system.

FIG. 1A is a block diagram depicting an embodiment of a memory system 100 that includes memory cells 101. The memory system 100 may include, for example, thousands, millions, or billions of the memory cells 101, depending on a desired implementation. A pre-program data signal 105 is coupled to each memory cell 101. Asserting a pre-program signal 102 enables a memory cell 101 to be programmed with a value corresponding to a respective pre-program data signal 105. A reprogram signal 103 is also coupled to the memory cells 101. The reprogram signal 103 enables each memory cell 101 to be programmed via a respective reprogram-data signal 104.

Figure 1B:
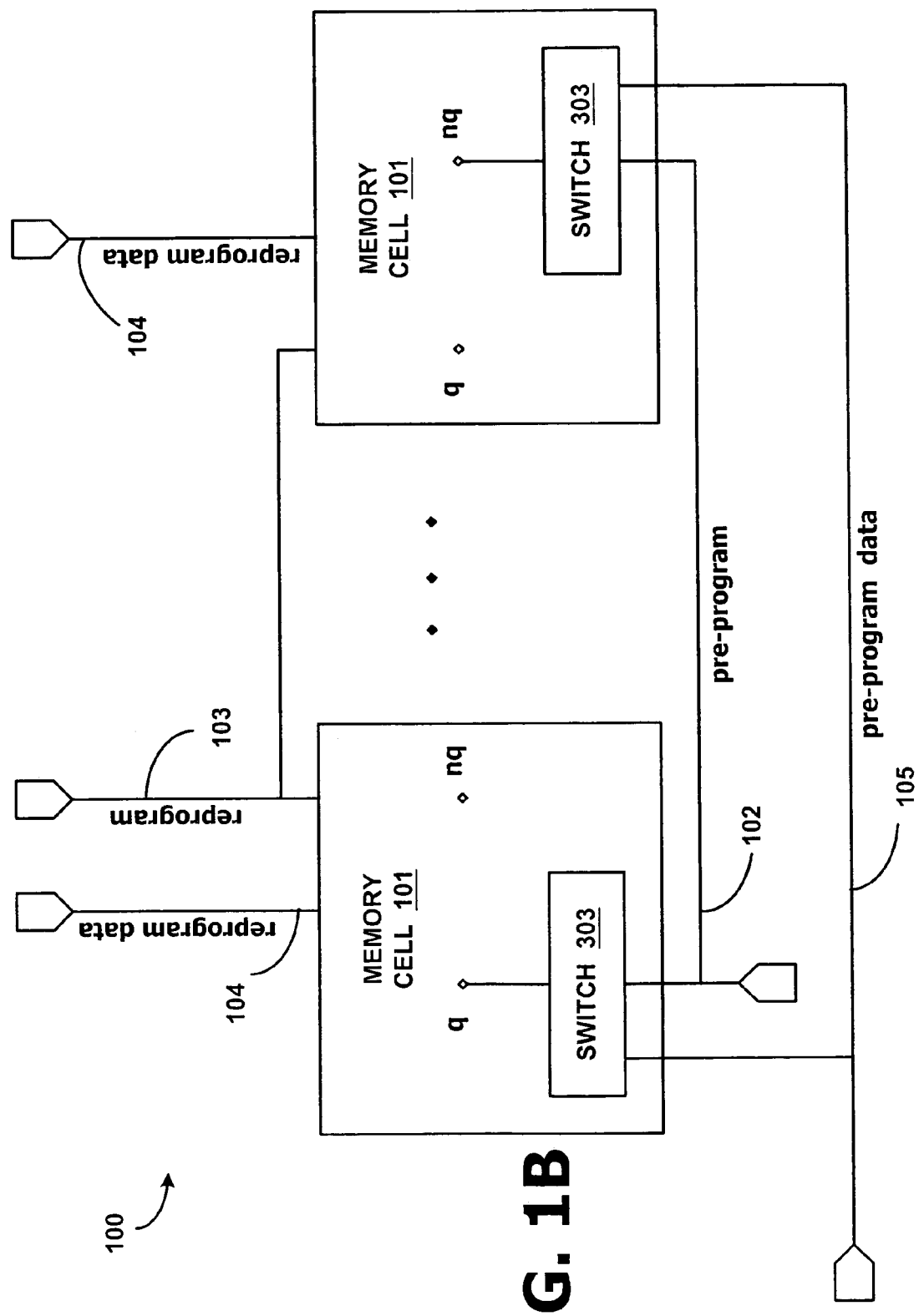
FIG. 1B is a block diagram depicting an embodiment of the memory system shown in FIG. 1A.
Figure 2A:
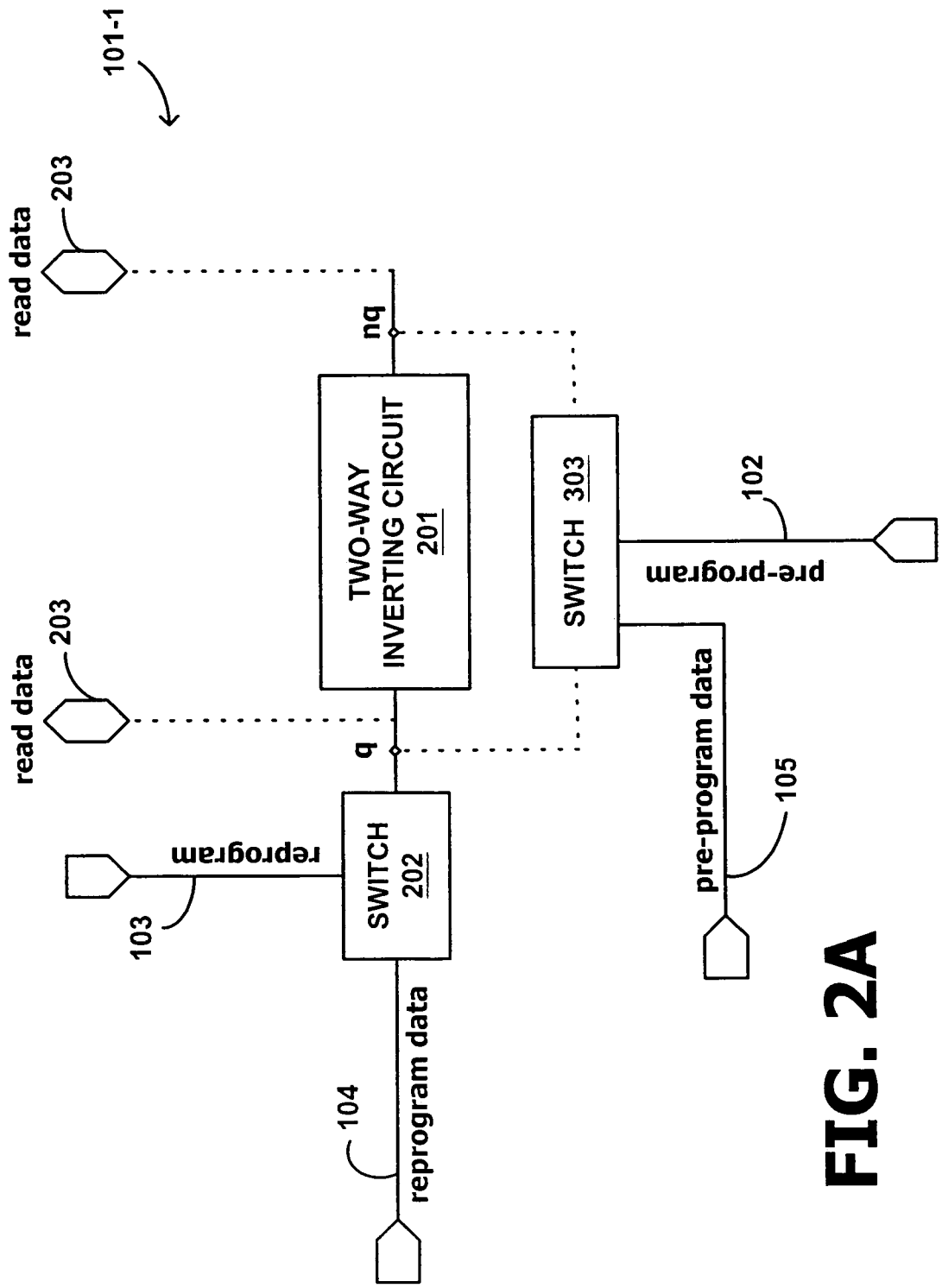
FIG. 2A is a block diagram depicting an embodiment of a memory cell shown in FIG. 1A.
Figure 2B:
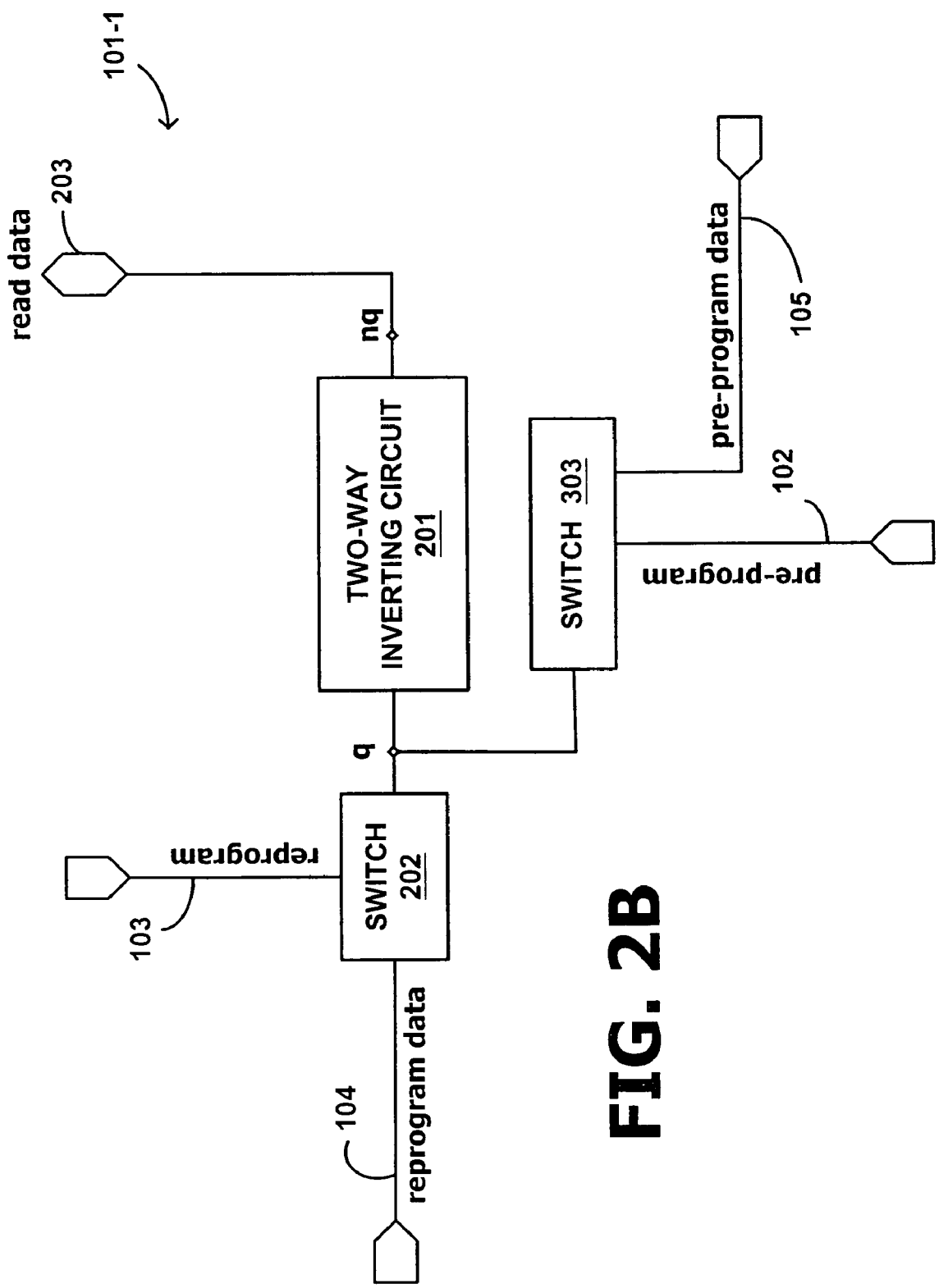
FIG. 2B is a block diagram depicting a specific implementation of the memory cell shown in FIG. 2A.

FIG. 1B is a block diagram depicting an embodiment of the memory system 100 shown in FIG. 1A. Certain specific embodiments of the memory system 100 are illustrated in FIGS. 2A, 2B, and 3 as memory systems 101-1, 101-2, and 101-3, respectively. As shown in FIG. 1B, switches 303 are coupled to (e.g., hard-wired to) q nodes in some of the memory cells 101, and to nq nodes in some of the other memory cells 101. In each cell, the nq node assumes a logic value that is opposite to the logic value of the respective q node, and vice versa. Therefore, by asserting the pre-program signal 102, some memory cells 101 are pre-programmed as a logic-high and other memory cells are pre-programmed as a logic-low, depending on whether a switch 303 is coupled to the q node or to the nq node of a respective memory cell. In this manner, asserting the pre-program signal 102 enables the memory cells 101 to be programmed with predetermined firmware comprising a sequence of respective logic values.

Note that in a preferred embodiment each switch 303 is not configured to switch between a q node and an nq node. Instead, the switch 303 is either connected (e.g., hard-wired) to the q node or to the nq node of a corresponding memory cell 101. In this manner, asserting the pre-program signal 102 may cause a node (q or nq) that is coupled to a switch 303 to assume a predetermined value (e.g., logic 1 or logic 0), as will be explained in more detail below.

Table 1 below illustrates an example of using a switch 303 to enable pre-programming memory cells 101. In this example only nine memory cells are considered to simplify the illustration. As shown in Table 1, the switch 303 is coupled (e.g., hard-wired) to the q node of a memory cell 101 if such memory cell 101 is to be pre-programmed as a logic-high, and is coupled to the nq node of a memory cell 101 if such memory cell 101 is to be pre-programmed as a logic-low. A sequence of memory cells 101 are programmed with respective logic values depending on firmware that is to be programmed into the memory system 100. Examples of components for enabling the programming of q nodes and nq nodes are illustrated in FIGS. 2A, 2B, and 3, and will be discussed further below. Factors that determine the value with which a memory cell is pre-programmed include, for example, the value of the pre-program data signal (e.g., corresponding to logic 1 or logic 0) and whether the memory cell output corresponds to the q node or to the nq node.

TABLE 1 example of using a pre-program signal to pre-program memory cells

| memory cell | switch 303 coupled to | memory cell pre-programmed |
|---|---|---|
| 1 | q | 1 |
| 2 | q | 1 |
| 3 | nq | 0 |
| 4 | q | 1 |
| 5 | nq | 0 |
| 6 | nq | 0 |
| 7 | nq | 0 |
| 8 | q | 1 |
| 9 | nq | 0 |

In the example shown in Table 1, the memory cells 1–9 are programmed with the logic values 1, 1, 0, 1, 0, 0, 0, 1, and 0, respectively. These logic values (110100010) correspond to a portion of firmware code that is to be programmed into the memory system 100. The example in Table 1 may apply, for example, to memory cells 101 that receive a pre-program data signal 105 corresponding to a logic 0, but where the output of the memory cells 101 corresponds to the nq nodes of the respective memory cells. The example in Table 1 may also apply, for example, to memory cells 101 that receive a pre-program data signal 105 corresponding to a logic 1, but where the output of the memory cells 101 corresponds to the q nodes of the respective memory cells.

Table 2 below illustrates another example of using a switch 303 to pre-program memory cells 101. As shown in Table 2, the switch 303 is coupled to the q node of a memory cell 101 if such memory cell 101 is to be pre-programmed as a logic-low, and is coupled to the nq node of a memory cell 101 if such memory cell 101 is to be pre-programmed as a logic-high.

TABLE 2 another example of using a pre-program signal to pre-program memory cells

| memory cell | switch 303 coupled to | memory cell pre-programmed |
|---|---|---|
| 1 | q | 0 |
| 2 | q | 0 |
| 3 | nq | 1 |
| 4 | q | 0 |
| 5 | nq | 1 |
| 6 | nq | 1 |
| 7 | nq | 1 |
| 8 | q | 0 |
| 9 | nq | 1 |

The example in Table 2 may apply, for example, to memory cells 101 that receive a pre-program data signal 105 corresponding to a logic 0, but where the output of the memory cells 101 corresponds to the q nodes of the respective memory cells. The example in Table 2 may also apply, for example, to memory cells 101 that receive a pre-program data signal 105 corresponding to a logic 1, but where the output of the memory cells 101 corresponds to the nq nodes of the respective memory cells.

FIG. 2A is a block diagram depicting an embodiment 101-1 of the memory cell 101 shown in FIG. 1A. As shown in FIG. 2A, the memory cell 101-1 includes a two-way inverting circuit 201 and a switch 202 (e.g., a transistor). The two-way inverting circuit 201 enables the q node to have a logic value that is the inverse of the nq node, and vice versa. The switch 202 enables the reprogram-data signal 104 to determine the values of the q and nq nodes when the reprogram signal 103 is asserted. A plurality of reprogram data signals 104 are used to reprogram a plurality of memory cells 101-1 with a sequence of respective logic values corresponding to desired firmware.

The switch 303 enables the pre-program data signal 105 to determine the value stored in the memory cell 101-1 when the pre-program signal 102 is asserted. The switch 303 is either connected (e.g., hard-wired) to the q node or to the nq node, depending on a desired value for pre-programming the memory cell 101-1 (e.g., depending on firmware to be pre-programmed in a plurality of memory cells 101-1).

FIG. 2B depicts an example of a switch 303 that is connected (e.g., hard-wired) to the q node (e.g., not coupled to the nq node). In this example, the memory cell 101-1 would be pre-programmed with a value that is opposite to the pre-program data signal 105 when the pre-program signal 102 is asserted. This is because the read data signal 203 (e.g., the memory cell's output) is coupled to node nq, that acquires an opposite value to that of the q node (which in this example is set equal to the pre-program data signal 105). In other implementations, the read data signal 203 and the pre-program data signal 105 may be coupled to the same node (e.g., both coupled to the q node, or both coupled to the nq nodes). In these implementations, the memory cell 101-1 would be pre-programmed with a value that is equal to the pre-program data signal 105 when the pre-program signal 102 is asserted.

Figure 2C:
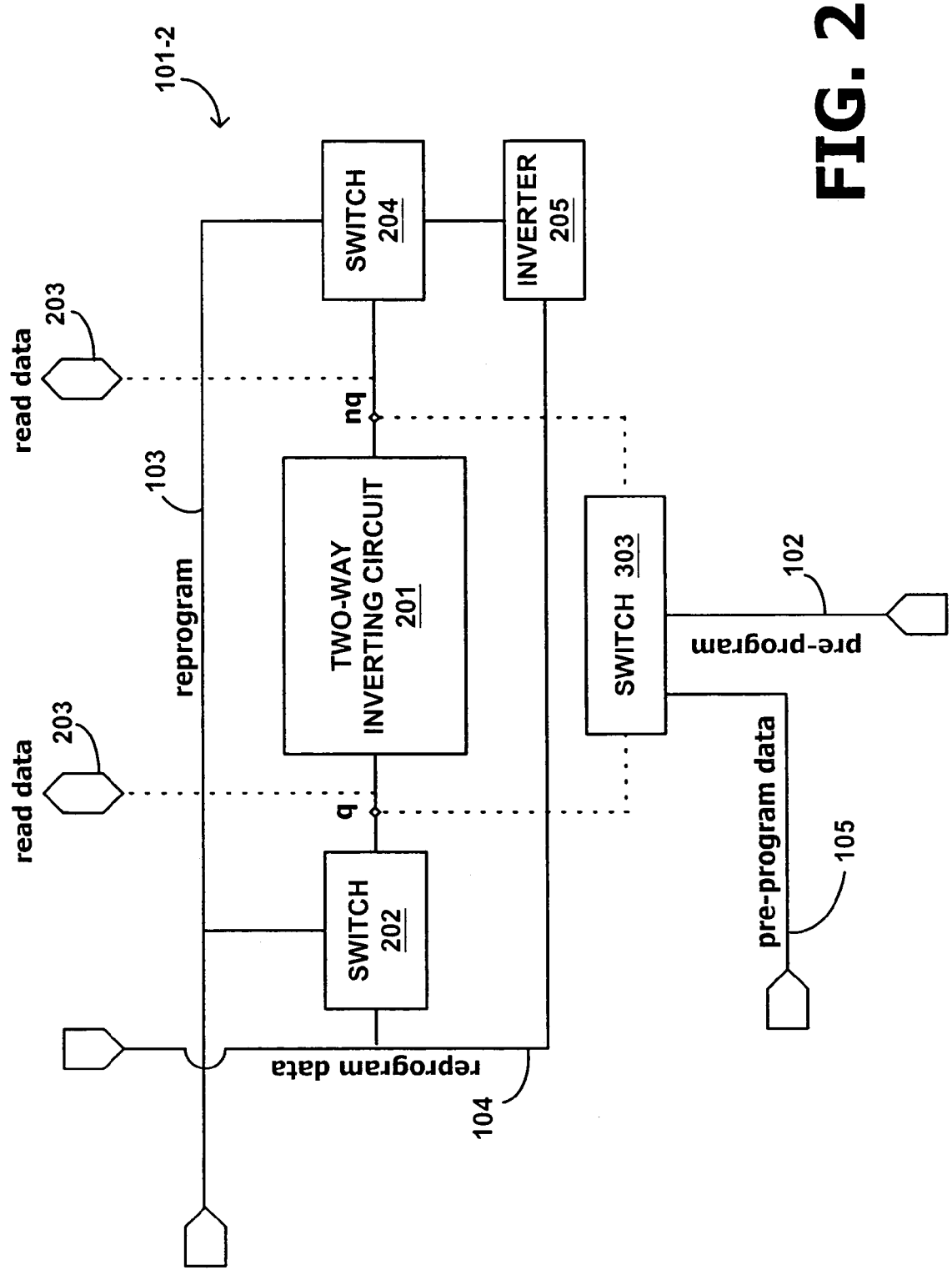
FIG. 2C is a block diagram depicting another embodiment of a memory cell shown in FIG. 1A.

FIG. 2C is a block diagram depicting another embodiment 101-2 of the memory cell 101 shown in FIG. 1A. As shown in FIG. 2B, the memory cell 101-2 includes a two-way inverting circuit 201, switches 202 and 204, and an inverter 205. The two-way inverting circuit 201 enables the q node to have a logic value that is the inverse of the logic value of the nq node, and vice versa. The switch 202 enables the reprogram-data signal 104 to determine the values of the q and nq nodes when the reprogram signal 103 is asserted. A plurality of reprogram data signals 104 are used to reprogram a plurality of memory cells 101-2 with a sequence of respective logic values corresponding to desired firmware. The switch 303 enables the pre-program data signal 105 to determine the value stored in the memory cell 101-2 when the pre-program signal 102 is asserted. The switch 303 is either connected (e.g., hard-wired) to the q node or to the nq node, depending on a desired value for pre-programming the memory cell 101-2 (e.g., depending on firmware to be pre-programmed in a plurality of memory cells 101-2).

The switch 204 enables the reprogram-data signal 104 to determine the value of the nq node when the reprogram signal 103 is asserted. The inverter 205 inverts the reprogram-data signal 104 such that the nq node is coupled to an inverse value of the reprogram-data signal 104 via the switch 204 when the reprogram signal 103 is asserted. Coupling the reprogram-data signal 104 to the nq node via the inverter 205 and switch 204 helps to ensure that the values of the node nq becomes the inverse of the value of the node q.

Figure 2D:
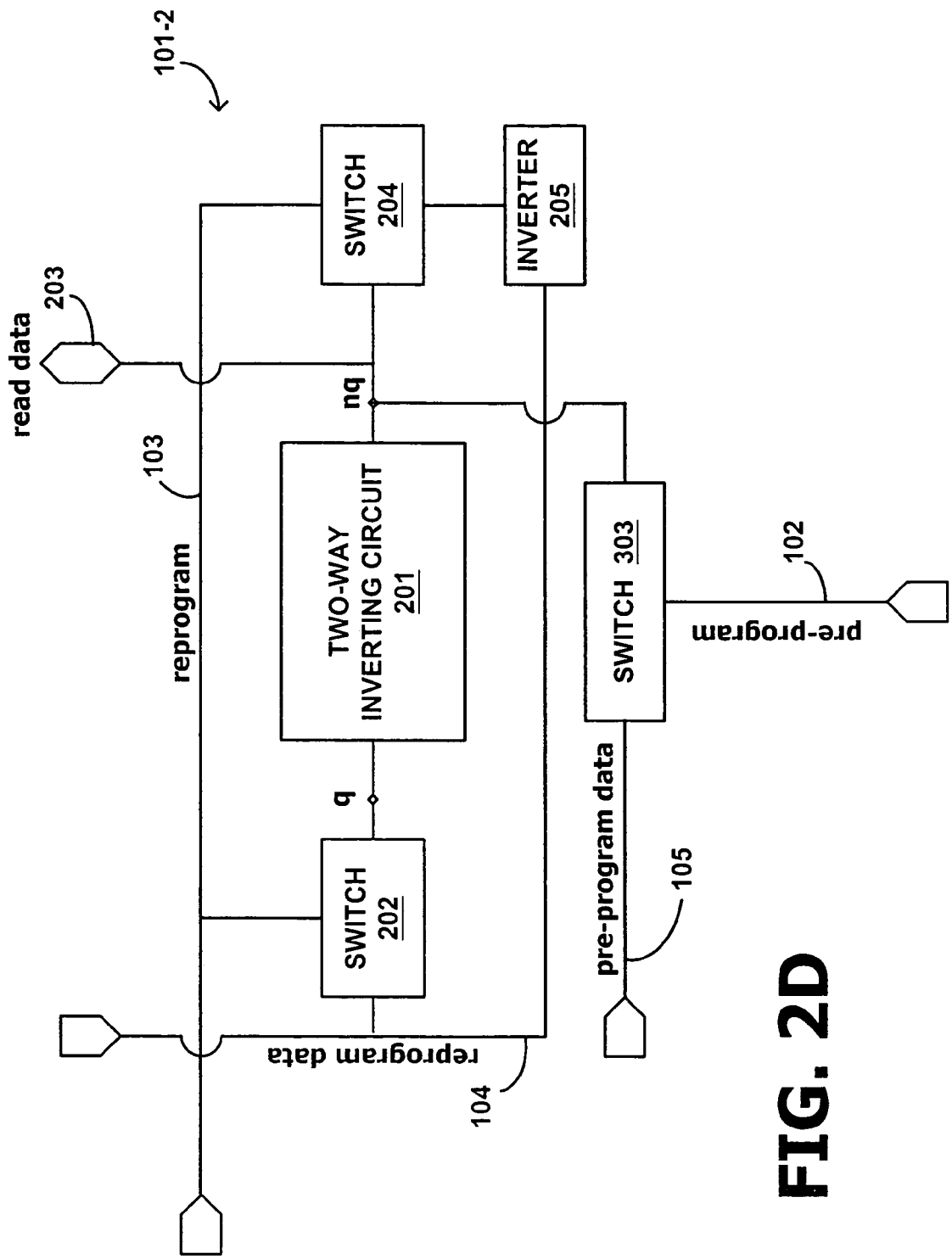
FIG. 2D is a block diagram depicting a specific implementation of the memory cell shown in FIG. 2C.

FIG. 2D depicts an example of a switch 303 that is connected (e.g., hard-wired) to the nq node (e.g., not coupled to the q node). In this example, the memory cell 101-2 would be pre-programmed with a value that is equal to the pre-program data signal 105 when the pre-program signal 102 is asserted. This is because the read data signal 203 (e.g., the memory cell's output) is also coupled to the nq node (which in this example is set equal to the pre-program data signal 105). In other implementations, the read data signal 203 and the pre-program data signal 105 may be coupled to different nodes (e.g., one signal coupled to the q node, and the other coupled to the nq node). In these implementations, the memory cell 101-2 would be pre-programmed with a value that is opposite to the pre-program data signal 105 when the pre-program signal 102 is asserted.

Figure 3A:
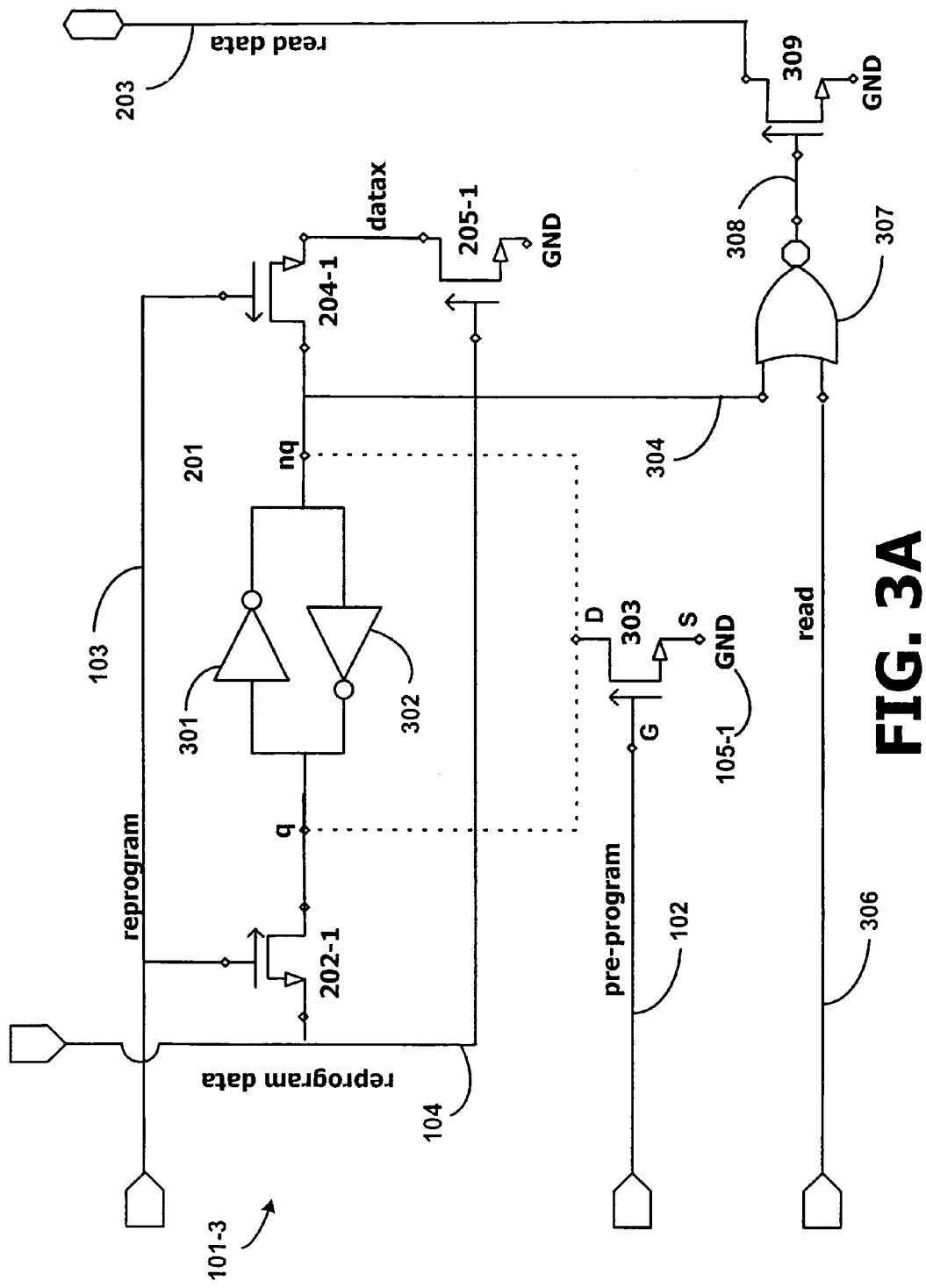
FIG. 3A is a block diagram depicting yet another embodiment of a memory cell shown in FIG. 1A.

FIG. 3A is a block diagram depicting yet another embodiment 101-3 of the memory cell 101 shown in FIG. 1A. As shown in FIG. 3, the memory cell 101-3 includes a two-way inverting circuit 201, a NOR gate 307, and transistors 202-1, 204-1, 205-1, 303, and 309. The two-way inverting circuit 201 includes inverters 301 and 302. The inverter 301 enables the nq node to have the inverse logic value of the q node. Conversely, the inverter 302 enables the q node to have the inverse value of the nq node. The transistors 202-1, 204-1, and 205-1 may operate in the same manner as the switches 202, 204, and 205, respectively, as described in reference to FIG. 2B.

The transistor 303 is coupled to (e.g., hard-wired to) either the q node or to the nq node. In other words, the drain of the transistor 303 is either coupled to the q node (if the memory cell 101-3 is to be programmed with a "low" logic value) or to the nq node (if the memory cell 101-3 is to be programmed with a "high" logic value). Coupling the transistor 303 to either the q node or the nq node enables a sequence of memory cells 101-3 to be programmed with respective logic values depending on firmware that is to be programmed into in the memory system 100. It should be understood that, in other implementations, whether the drain of the transistor 303 is coupled to the q node or to the nq node may depend on factors such as, for example, whether the read-data signal 203 is configured to have the same logic value as the q node or as the nq node.

As shown in FIG. 3, a read signal 306 and the nq node are coupled to a NOR gate 307. As a result, when the read signal 306 is asserted low, then the logic value of the NOR gate output 308 becomes the inverse of the logic value of the nq node. Consequently, the logic value of the read-data signal 203 becomes equal to the logic value of the nq node.

Figure 3B:
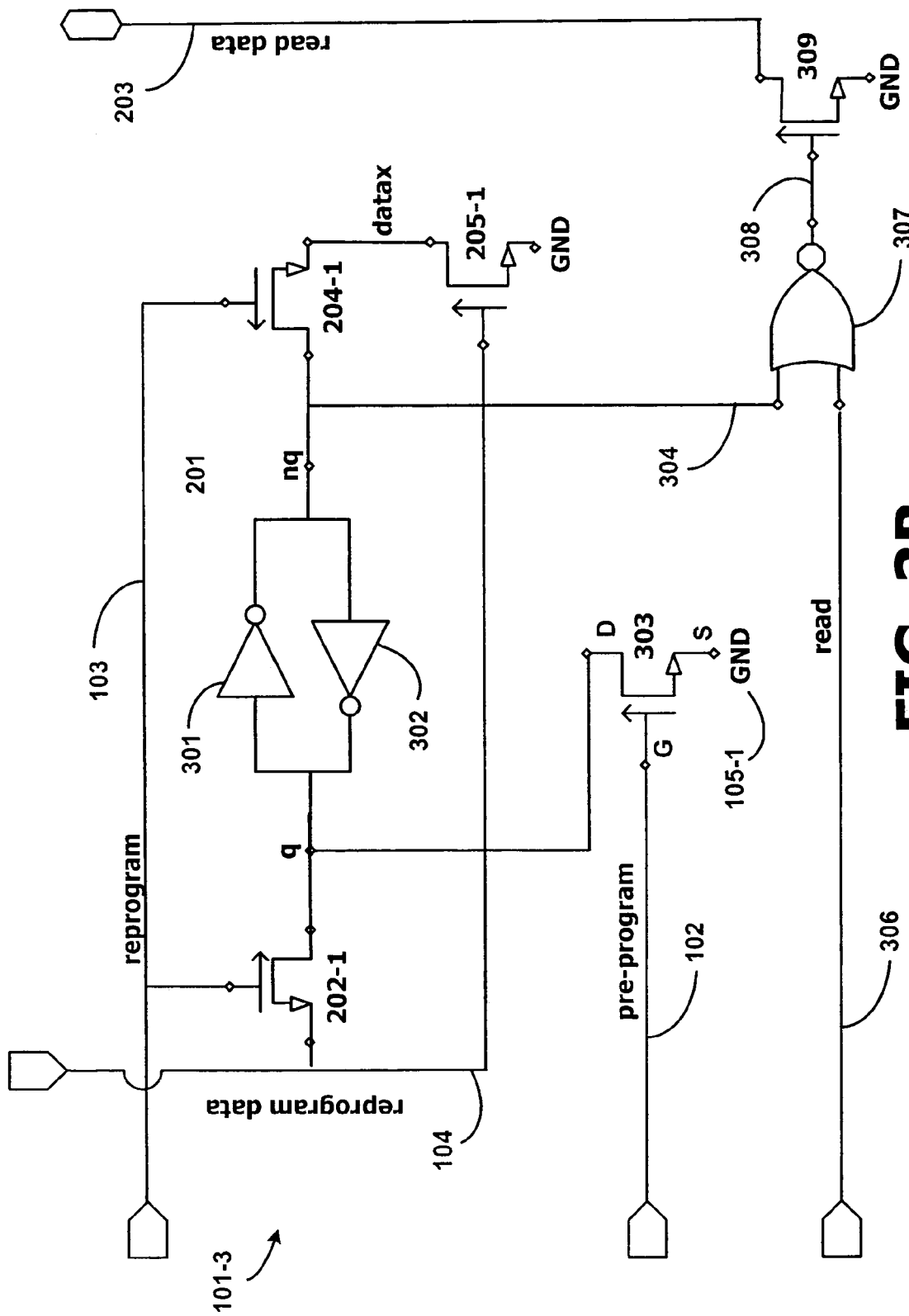
FIG. 3B is a block diagram depicting a specific implementation of the memory cell shown in FIG. 3A.

FIG. 3B shows an example of a memory cell 101-3 where the transistor 303 is coupled to the q node and where the read data signal 203 is configured to output the value of the nq node. Asserting the pre-program signal 102 causes the q node to have a low logic value (e.g., corresponding to ground 105-1) and the nq node to have a high logic value (since the nq node is configured to acquire the inverse logic value of the q node). Therefore, asserting the pre-program signal 102 causes the memory cell 101-3 to be programmed with a logic 1 value (e.g., since the read data signal 203 outputs a logic value that is opposite to ground 105-1 when the read signal 306 is asserted after the pre-program signal 102 has been asserted).

Figure 3C:
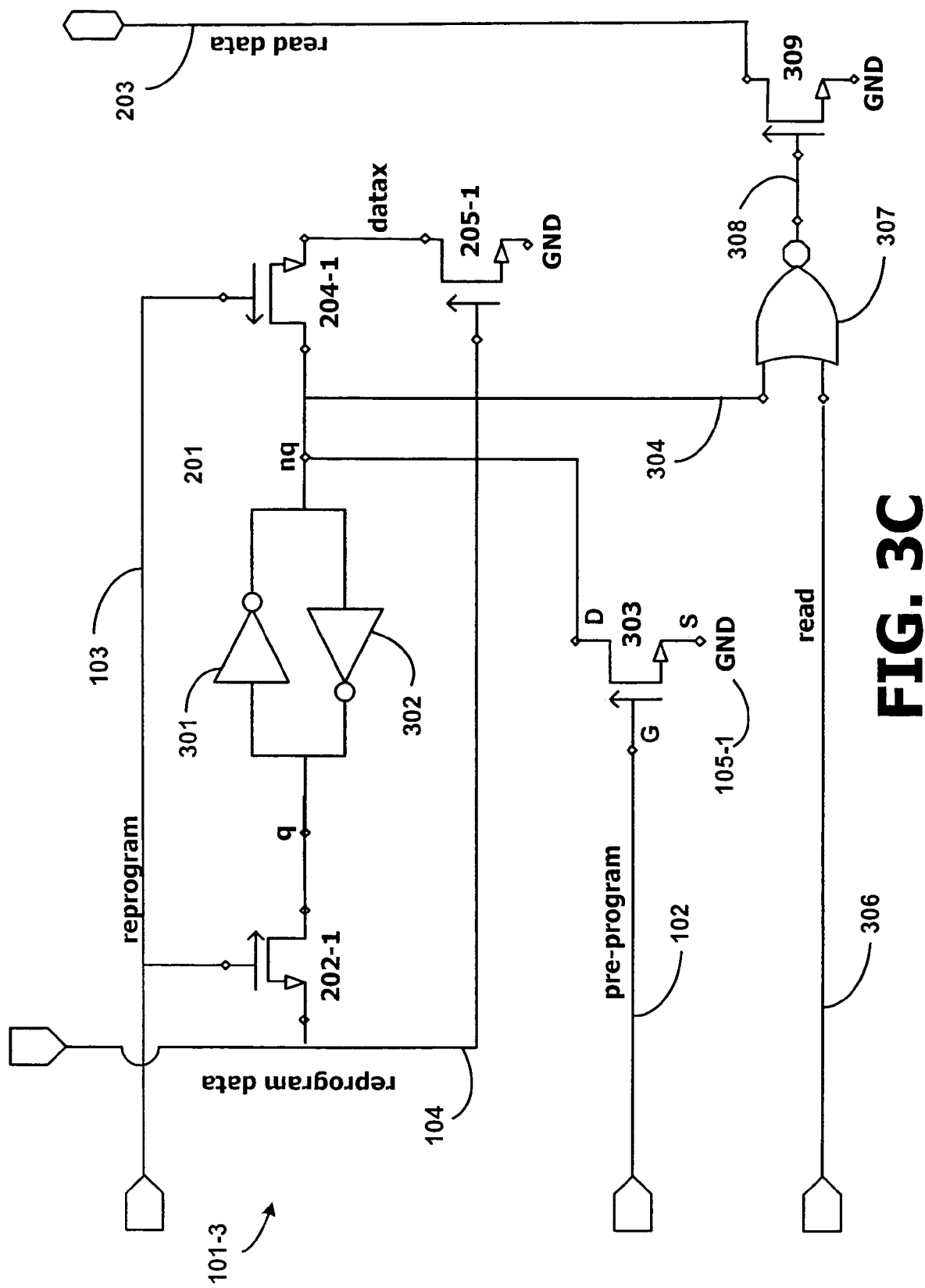
FIG. 3C is a block diagram depicting another specific implementation of the memory cell shown in FIG. 3A.

FIG. 3C shows another example of a memory cell 101-3 where the transistor 303 is coupled to the nq node and where the read data signal 203 is configured to output the value of the nq node. Asserting the pre-program signal 102 causes the nq node to have a low logic value (e.g., corresponding to ground 105-1). Therefore, asserting the pre-program signal 102 causes the memory cell 101-3 to be programmed with a logic 0 value (e.g., same as ground 105-1).

FIG. 4 is a flow chart depicting an embodiment of a method 400 for utilizing the memory system 100 depicted in FIG. 1A. As indicated in step 401, a memory system 100 having a first and second plurality of memory cells 101 is provided. Each of the memory cells 101 includes a q node and an nq node that are configured to have opposite logic values. A pre-program data signal 105 is provided to the q nodes of the first plurality of memory cells 101 and to the nq nodes of the second plurality of memory cells 101, as indicated in step 402. This pre-program data signal 105 enables the memory system 100 to be pre-programmed with desired firmware. For example, when the pre-program data signal 105 is coupled to the q node of a memory cell 101, then such memory cell 101 is pre-programmed with a high logic value, or vice versa, depending on a desired implementation. Coupling the pre-program data signal 105 to either the q node or the nq node enables a sequence of memory cells 101 to be programmed with respective logic values depending on firmware that is to be programmed into the memory system 100.

At a later time, a reprogram-data signal is provided to the q nodes of the first and second plurality of memory cells 101 and/or an inverse of the reprogram-data signal is provided to the nq nodes of the first and second plurality of memory cells 101, as indicated in step 403. This reprogram-data signal enables the memory system 100 to be reprogrammed (e.g., with different firmware). The logic values of the q nodes or of the nq nodes of the first and second plurality of memory cells 101 may be output (e.g., read) when desired, as indicated in step 404. These logic values may be output in order to, for example, enable the corresponding firmware to be executed.

Figure 5:
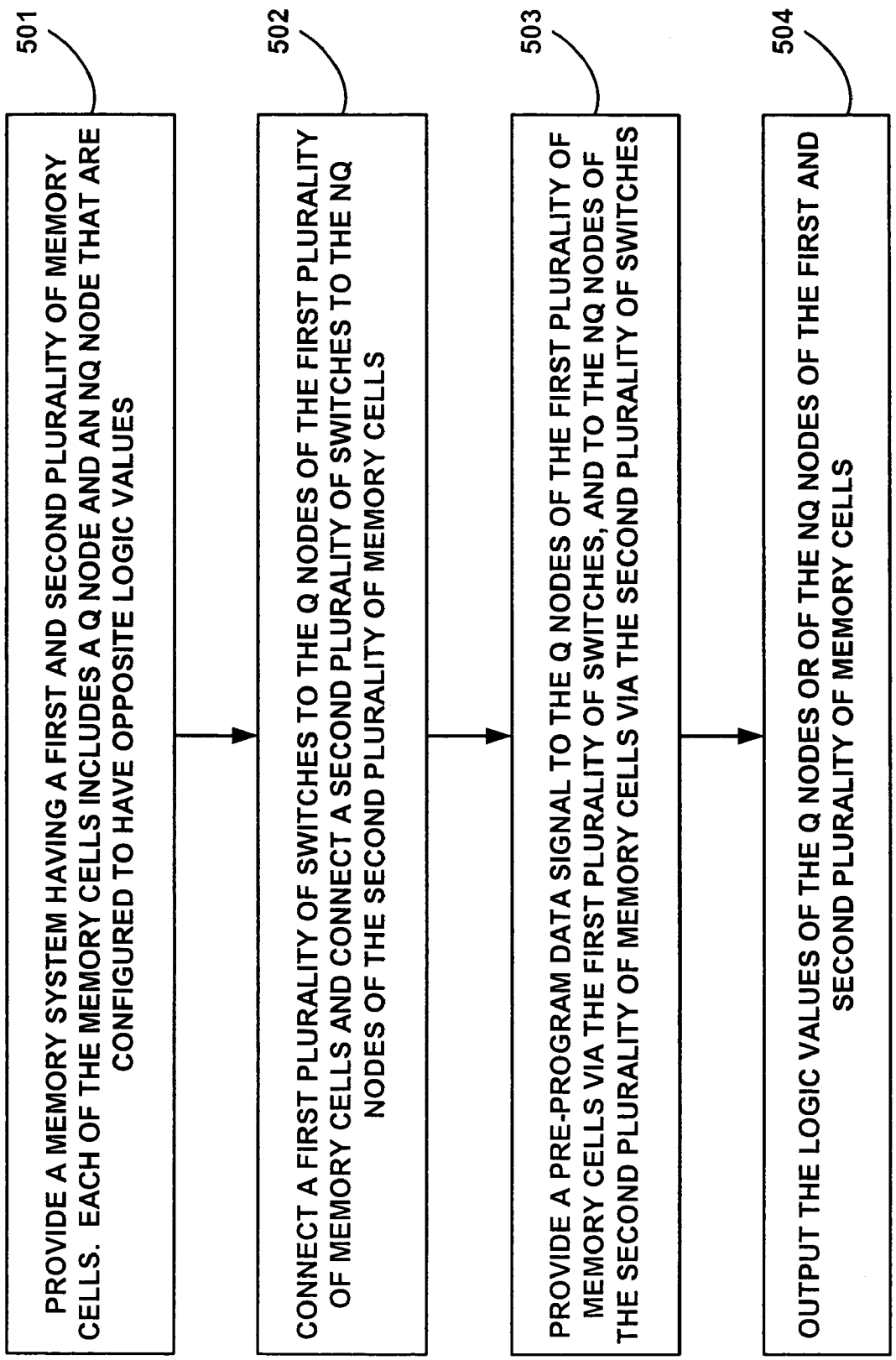
FIG. 5 is a flow chart depicting an embodiment of a method for implementing the memory system depicted in FIG. 1A.

FIG. 5 is a flow chart depicting an embodiment of a method 500 for implementing the memory system 100 depicted in FIG. 1A. As indicated in step 501, a memory system 100 having a first and second plurality of memory cells 101 is provided. Each of the memory cells 101 includes a q node and an nq node that are configured to have opposite logic values (e.g., by being coupled to a two-way inverting circuit).

A first plurality of switches 303 (FIG. 1B) are connected to the q nodes of the first plurality of memory cells 101 and a second plurality of switches 303 are connected to the nq nodes of the second plurality of memory cells 101, as indicated in step 502. By connecting different switches 303 to different types of nodes (q or nq), the first and second plurality of memory cells 101 may be subsequently pre-programmed with values corresponding to desired firmware.

A pre-program data signal 105 is provided to the q nodes of the first plurality of memory cells 101 via the first plurality of switches 303, and to the nq nodes of the second plurality of memory cells 101 via the second plurality of switches 303, as indicated in step 503. This pre-program data signal 105 enables a sequence of memory cells 101 (comprising the first and second plurality of memory cells 101) to be pre-programmed with respective logic values corresponding to firmware that is to be pre-programmed into in the memory system 100. For example, memory cells 101 wherein a switch 303 is coupled to a q node are pre-programmed with a logic 1 value, and memory cells 101 wherein a switch 303 is coupled to an nq node are pre-programmed with a logic 0 value (or vice versa, depending on a desired implementation). The logic values of the q nodes or of the nq nodes of the first and second plurality of memory cells 101 may be output (e.g., read) when desired, as indicated in step 504.

It should be emphasized that the above-described embodiments are mere examples of possible implementations. Therefore, many variations and modifications may be made to the above-described embodiments. All such modifications and variations are intended to be included herein within the scope of the disclosure.

What is claimed is:

1. A memory system comprising:
    a first plurality of memory cells, wherein each of the first plurality of memory cells includes a first node and a second node that are configured to have opposite logic values; and
    a second plurality of memory cells, wherein each of the second plurality of memory cells includes a first node and a second node that are configured to have opposite logic values;
    a first plurality of switches that are coupled the first nodes of the first plurality of memory cells;
    a second plurality of switches that are coupled the second nodes of the second plurality of memory cells; and
    wherein providing a pre-program data value to the first nodes of the first plurality of memory cells via the first plurality of switches, and to the second nodes of the second plurality of memory cells via the second plurality of switches enables the memory system to be pre-programmed.

2. The memory system of claim 1, further comprising a connection configured to provide a reprogram-data signal to the first nodes of the first and second plurality of memory cells, wherein the reprogram-data signal enables the memory system to be reprogrammed.

3. The memory system of claim 1, further comprising a connection configured to provide a reprogram-data signal to the second nodes of the first and second plurality of memory cells, wherein the reprogram-data signal enables the memory system to be reprogrammed.

4. The memory system of claim 1, further comprising a connection configured to provide a reprogram-data signal to the first nodes of the first and second plurality of memory cells, and an inverse of the reprogram-data signal to the second nodes of the first and second plurality of memory cells, wherein the reprogram-data signal and the inverse of the reprogram-data signal enable the memory system to be reprogrammed.

5. The memory system of claim 1, wherein the memory system is configured to output the logic values of the first nodes of the first and second plurality of memory cells.

6. The memory system of claim 1, wherein the memory system is configured to output the logic values of the second nodes of the first and second plurality of memory cells.

7. The memory system of claim 1, further comprising two-way inverting circuits coupled between respective first and second nodes of each of the first and second plurality of memory cells, wherein each of the two-way inverting circuits is configured to enable a respective first node to have an opposite logic value as a corresponding second node.

8. The memory system of claim 7, further comprising a first plurality of switches coupled to respective first nodes of the first plurality of memory cells, wherein each of the first plurality of switches is configured to provide a reprogram data signal to a respective first node responsive to a reprogram signal.

9. The memory system of claim 8, further comprising a second plurality of switches coupled to respective second nodes of the second plurality of memory cells, wherein each of the second plurality of switches is configured to provide an inverse of the reprogram data signal to a respective second node responsive to the reprogram signal.

10. A method for pre-programming a memory system having a first and second plurality of memory cells, wherein each of the first and second plurality of memory cells includes a first node and a second node, the method comprising:
    providing a pre-program data value to the first nodes of the first plurality of memory cells via a first plurality of respective switches that are respectively coupled to the first nodes; and
    providing the pre-program data value to the second nodes of the second plurality of memory cells via a second plurality of respective switches that are respectively coupled to the second nodes.

11. The method of claim 10, further comprising providing a reprogram-data signal to the first nodes of the first and second plurality of memory cells to enable the memory system to be reprogrammed.

12. The method of claim 10, further comprising providing a reprogram-data signal to the second nodes of the first and second plurality of memory cells to enable the memory system to be reprogrammed.

13. The method of claim 10, further comprising providing a reprogram-data signal to the first nodes of the first and second plurality of memory cells, and providing an inverse of the reprogram-data signal to the second nodes of the first and second plurality of memory cells to enable the memory system to be reprogrammed.

14. The method of claim 10, further comprising outputting the logic values of the first nodes of the first and second plurality of memory cells.

15. The method of claim 10, further comprising outputting the logic values of the second nodes of the first and second plurality of memory cells.

16. A pre-programmable memory system comprising:
    a first and second plurality of memory cells, wherein each of the first and second plurality of memory cells includes a first node and a second node that are configured to have opposite logic values; and
    means for providing a pre-program data value to the first nodes of the first plurality of memory cells via a first plurality of respective switches that are respectively coupled to the first nodes and to the second nodes of the second plurality of memory cells via a second plurality of respective switches that are respectively coupled to the second nodes.

17. The memory system of claim 16, further comprising:
means for providing a reprogram-data signal to the first nodes of the first and second plurality of memory cells to enable the memory system to be reprogrammed.

18. The memory system of claim 16, further comprising:
means for providing a reprogram-data signal to the second nodes of the first and second plurality of memory cells to enable the memory system to be reprogrammed.

19. The memory system of claim 16, further comprising:
means for providing a reprogram-data signal to the first nodes of the first and second plurality of memory cells, and providing an inverse of the reprogram-data signal to the second nodes of the first and second plurality of memory cells to enable the memory system to be reprogrammed.

20. The memory system of claim 16, further comprising:
means for outputting the logic values of the first nodes of the first and second plurality of memory cells.

21. The memory system of claim 16, further comprising:
means for outputting the logic values of the second nodes of the first and second plurality of memory cells.

22. A system for programming a memory system having a first and second plurality of memory cells, wherein each of the first and second plurality of memory cells includes a first node and a second node, the system comprising:

means for providing a pre-program data value to the first nodes of the first plurality of memory cells via a first plurality of respective switches that are respectively coupled to the first nodes; and means for providing the pre-program data value to the second nodes of the second plurality of memory cells via a second plurality of respective switches that are respectively coupled to the second nodes.

* * * * *

UNITED STATES PATENT AND TRADEMARK OFFICE
CERTIFICATE OF CORRECTION

PATENT NO.        : 7,035,134 B2
APPLICATION NO. : 10/791131
DATED             : April 25, 2006
INVENTOR(S)       : Scott A. Anderson et al.

It is certified that error appears in the above-identified patent and that said Letters Patent is hereby corrected as shown below:

In column 7, line 37, in Claim 1, after "coupled" insert -- to --.

In column 7, line 39, in Claim 1, after "coupled" insert -- to --.

In column 8, line 18, in Claim 9, delete "wherein-each" and insert -- wherein each --, therefor.

Signed and Sealed this

Twenty-first Day of April, 2009

JOHN DOLL
*Acting Director of the United States Patent and Trademark Office*